United States Patent [19]

Iacovangelo

[11] Patent Number: 5,194,295

[45] Date of Patent: Mar. 16, 1993

[54] CERAMIC ARTICLES HAVING HEAT-SEALABLE METALLIC COATINGS AND METHOD OF PREPARATION

[75] Inventor: Charles D. Iacovangelo, Schenectady, N.Y.

[73] Assignee: General Electric Company, Schenectady, N.Y.

[21] Appl. No.: 836,896

[22] Filed: Feb. 19, 1992

Related U.S. Application Data

[62] Division of Ser. No. 718,698, Jun. 21, 1991, Pat. No. 5,132,185.

[51] Int. Cl.$^5$ ............................ B05D 5/12; B05D 1/18; C25D 11/34
[52] U.S. Cl. .......................... 427/98; 427/125; 427/304; 427/305; 427/404; 427/437; 427/438; 427/443.1
[58] Field of Search ............... 427/98, 404, 443.1, 427/125, 304, 305, 437, 438, 383.9; 428/672, 668, 669, 663, 610

[56] References Cited

U.S. PATENT DOCUMENTS

| | | | |
|---|---|---|---|
| 3,986,255 | 10/1976 | Mandal | 427/125 |
| 4,465,742 | 8/1984 | Nagashima | 428/672 |
| 4,474,838 | 10/1984 | Halecky et al. | 427/436 |
| 4,495,255 | 1/1985 | Draper et al. | 428/672 |
| 4,675,243 | 6/1987 | Obinata et al. | 428/672 |
| 4,804,559 | 2/1989 | Ushio et al. | 427/96 |
| 4,956,026 | 9/1990 | Bell | 148/127 |
| 4,963,974 | 10/1990 | Ushio et al. | 428/663 |

Primary Examiner—Shrive Beck
Assistant Examiner—David M. Maiorana
Attorney, Agent, or Firm—William H. Pittman

[57] ABSTRACT

Nickel or cobalt diffusion is suppressed in ceramic articles having a nickel or cobalt underlayer followed by a gold overlayer, by heat-treating the article in a reducing atmosphere at a temperature of at least about 650° C. and subsequently depositing a final gold layer. By suppressing the diffusion of nickel or cobalt, the adhesion of hermetic lids attached thereto by soldering is improved.

10 Claims, No Drawings

CERAMIC ARTICLES HAVING HEAT-SEALABLE METALLIC COATINGS AND METHOD OF PREPARATION

This application is a division of application Ser. No. 07/718,698, filed Jun. 21, 1991, now U.S. Pat. No. 5,132,185.

This invention relates to the manufacture of microelectronic circuits, and more particularly to a method of improving adhesion of metallic gold layers thereto.

Microelectronic units typically include a metallized ceramic package in which one or more electronic chips are mounted on die pads. In the mounting process, hereinafter sometimes designated "die-attach", each chip is normally fastened in place by soldering, whereby a gold-tin solder on the chip contacts an adherent layer of metallic gold on the die pad. The solder and metallic gold are melted by heating at temperatures above 400° C., typically about 420° C., for a suitable period of time, typically 1-8 minutes, after which the chip is mounted and the gold is allowed to solidify.

The gold is itself deposited via electrolytic or electroless deposition on a layer of another metal which facilitates electrically conductive connection with other circuit elements by soldering. Nickel and cobalt, and especially nickel, are frequently used for this purpose; frequent reference to nickel will be made hereinafter, but it should be understood that cobalt can be substituted for nickel when appropriate.

Following die-attach, the package is hermetically sealed by placing a lid thereover so that a sealing element of screen-printed solder, typically lead-tin solder, on said lid contacts a seal ring of metallic gold on the package. The resulting assembly is heated to just above the liquids of the solder, ordinarily to about 370° C., for a few minutes.

For reasons of economy and simplicity, the nickel and gold layers are ordinarily applied to all required areas of the metallized ceramic package in a single operation, which is followed by die-attach and subsequently by sealing. Thus, the entire package is exposed to the relatively high temperatures of die-attach. At these temperatures, there is frequently a substantial amount of diffusion of nickel through the gold layer to the surface thereof, where it is oxidized to nickel oxide. The latter severely impairs adhesion of the gold in the seal ring to the solder of the lid, causing incomplete sealing.

Various strategies have been employed to minimize the effects of nickel diffusion through the gold layer. One is to increase the thickness of the gold layer to a point where nickel diffusion to the surface thereof will be insignificant during the die-attach process. This generally requires gold layers of extreme thickness, since it is frequently found that a layer of three times the normal thickness is not adequate to completely suppress nickel diffusion to the surface. This strategy, therefore, is very expensive.

A second approach is to interpose between the nickel and gold layers a layer of a third metal which inhibits nickel diffusion and which does not itself diffuse as rapidly as nickel. Cobalt (when the first metal layer is actually nickel rather than cobalt) and platinum are typical metals of this type. Such interposition, however, obviously involves still another plating step and the use of additional expensive and strategic materials. Moreover, such metals as cobalt are only marginally less capable of diffusion than nickel.

Accordingly, interest continues in methods for inhibiting the diffusion of metals such as nickel and cobalt through gold layers. The present invention provides a method of this type. Also provided thereby are articles having on their surface a metallic layer which serves as a barrier to diffusion of such metals.

In one of its aspects, the present invention is a method for preparing a heat-sealable metal coating on a ceramic article having a nickel or cobalt underlayer and a metallic gold overlayer on at least a portion of its surface, said method comprising the steps of heat-treating said layers in a reducing atmosphere at a temperature of at least about 650° C., thereby causing diffusion of nickel or cobalt into and sintering of said gold overlayer and decreasing the nickel or cobalt activity therein, and depositing a final layer of metallic gold on said overlayer.

The ceramic articles which are provided with coatings according to this invention are known in the art. They typically include a ceramic base and a coating on at least a portion of the surface thereof of a conductive metal such as tungsten or molybdenum. The article typically comprises one or more die pads and at least one seal ring surrounding said die pads. The coated area includes the die pad(s) and seal ring. Also present are vias facilitating electrical connection with other circuits or other parts of the same circuit.

The ceramic article is provided with a nickel or cobalt underlayer applied over the coating of molybdenum, tungsten or the like. Said underlayer facilitates adhesion of electrical connectors via soldering. It may be applied by electrolytic or electroless means. Underlayers of this type are conventional, and their desired properties will be apparent to those skilled in the art.

Electroless nickel and cobalt plating baths frequently contain auxiliary elements such as boron, phosphorus or lead, which may impair the adhesion of gold layers deposited thereon. If such auxiliary elements are present, they should be removed from the surface prior to the deposition of the gold overlayer. This may be achieved by various methods. A method which is frequently preferred is heat treatment in a reducing atmosphere in the presence of water vapor. For example, an atmosphere which is predominantly argon but contains about 5% (by volume) hydrogen and about 1-3% water vapor may be employed. The water vapor assists in the removal of boron, and such treatment is otherwise effective to remove elements such as phosphorus and lead.

The article also contains a metallic gold overlayer on at least a portion of its surface. For the most part, said overlayer is applied to the underlayer by conventional electrolytic or electroless means. Electroless deposition, when employed, may be autocatalytic or non-autocatalytic.

The preferred electroless gold deposition baths are frequently the non-autocatalytic ones disclosed in U.S. Pat. No. 4,863,766, the disclosure of which is incorporated by reference herein; such baths comprise potassium gold cyanide, an alkali metal cyanide and hydrazine or a substituted hydrazine as a reducing agent, and have a pH in the range of 12-14.

The thickness of the overlayer on the ceramic article is not critical. It is most often in the range of about 0.1-0.5 micron.

According to the present invention, the underlayer and overlayer are heat-treated in a reducing atmosphere under conditions which cause diffusion of the underlayer material into and simultaneous sintering of the gold overlayer. These conditions include temperatures of at least about 650° C. and preferably about 680°–720° C. Any suitable reducing atmosphere may be employed, with the aforementioned mixtures of hydrogen and inert gases such as argon, especially those comprising about 5–10% hydrogen by volume, being preferred. The presence of water vapor is not necessary at this stage.

The results of the heat-treating step include diffusion of the nickel or cobalt into the gold layer and sealing of grain boundaries therein through sintering. As a result, the nickel activity of the overlayer is substantially decreased, whereby there is much less tendency for nickel to diffuse to the surface thereof and form nickel oxide.

In the second step of the method of the invention, a final layer of metallic gold is deposited on the heat-treated overlayer. This deposition step may employ the same electroless and/or electrolytic means previously employed for deposition of the overlayer. The thickness of the final layer is likewise not critical; it is most often in the range of about 1–5 microns.

The effect of the method of this invention is demonstrated via Auger spectroscopy, which determines the proportion of nickel or cobalt in the overlayer at various depths. It has been found that heat treatment of an article having a nickel underlayer and an electroless gold overlayer at a temperature of at least 650° C. substantially decreases the proportion of nickel, both elemental and combined, on the surface and below the surface of the overlayer. The proportion of nickel on the surface is generally less than about 10% by weight, as opposed to greater than 15% upon heat treatment at temperatures of 550° C. or less. Similar decreases in nickel proportion are seen at various points beneath the surface. Grain size of the gold in the overlayer is substantially increased by sintering in the heat-treated articles, with a corresponding decrease in the number of grain boundaries. Electrolytically deposited gold shows a similar trend.

It is believed that the overlayer deposited according to the method of this invention, having substantially decreased nickel or cobalt activity as compared with electroless or electrolytic gold layers freshly deposited over nickel or cobalt, is of a type not previously obtained on a ceramic article. Accordingly, another aspect of the invention is a metallized ceramic article having on at least a portion of its surface a sintered layer of metallic gold having nickel or cobalt interdiffused therein and having decreased nickel or cobalt activity compared with a freshly deposited gold layer. Said article preferably also has a final layer of metallic gold deposited on said interdiffused and sintered layer.

The invention is illustrated by the following examples.

EXAMPLE 1

Ceramic articles having an electroless nickel-boron coating thereon were first heated for 30 minutes at 850° C. in an argon atmosphere containing about 7% (by volume) hydrogen and about 2% water vapor, and then for 20 minutes in a similar atmosphere free from water vapor. An electroless gold overlayer having a thickness of about 2 microns was deposited on the articles by treatment for one minute in a solution of 5 grams potassium gold cyanide, 0.45 gram potassium cyanide, 50 grams potassium hydroxide and 25 ml. hydrazine hydrate in about 975 ml. of water.

The articles containing the electroless gold overlayer were heat-treated in the dry hydrogen-argon atmosphere for 20 minutes at various temperatures, after which a final layer of electroless gold having a thickness of about 2 microns was deposited by treatment in the same bath for about 50 minutes. The die-attach process was then simulated by heating the parts on a hot stage in air for 5 minutes at 420° C.

Auger spectroscopy was carried out on parts heat-treated at each temperature. The results are given in Table I in terms of approximate intensity of nickel concentration at various depths into the final gold layer. It should be noted that the principal form of nickel diffusion into the gold is grain boundary diffusion, and that the surface is enriched in nickel in combined form as nickel oxide. Also given in Table I is the weight percentage of nickel at the surface of the final gold layer.

TABLE I

| Heat treatment temperature, °C. | Depth, Angstroms | | | Nickel, % |
|---|---|---|---|---|
| | 0 | 100 | 200 | |
| 450 | 47,000 | 10,000 | 1,000 | 22 |
| 550 | 37,000 | 2,800 | 500 | 17 |
| 650 | 19,000 | 2,300 | 100 | 9 |
| 700 | 14,000 | 100 | 0 | 7 |

It is apparent that the proportion of nickel is substantially decreased at all depths into the final gold layer when the method of this invention, employing heat treatment temperatures of at least about 650° C., is employed. Moreover, there is a substantial decrease in the atomic percentage of nickel at the surface.

The parts were also analyzed by scanning electron microscopy, which showed that the gold overlayer was almost completely sintered when the method of this invention was employed, and that there was a dramatic increase in grain size and decrease in the number of grain boundaries. The same was not true of the samples which were heat-treated at temperatures lower than 650° C.

EXAMPLE 2

The procedure of Example 1 was repeated, except that the electroless gold overlayer was replaced by an electrolytically deposited overlayer. At a heat treatment temperature of 700° C., Auger spectroscopy showed nickel intensities at 0, 100 and 200 Angstroms of about 10,000, 700 and 0, respectively. A control in which no heat treatment was employed had nickel intensities of about 43,000, 7500 and 700, respectively. The atomic percentages of nickel at the surface for the article of the invention and the control were 7% and 20%, respectively.

EXAMPLE 3

Numerous parts were treated by the method of this invention as described in Example 1, with simulated die-attach times of 1 and 5 minutes. The parts were then subjected to a simulated lid-sealing operation, employing a conventional lead-tin solder. Non-wetting of the final gold layer by the solder was visually evaluated. All parts formed hermetic seals with the solder. The results are given in Table II.

| Run | Heat treatment temp., °C. | Final layer thickness microns | Number of parts Total | Number of parts Non-wetted | Die-attach time, min. |
| --- | --- | --- | --- | --- | --- |
| 1 | 700 | 2.3 | 1 | 8 | 1 |
| 2 | 700 | 1.9 | 1 | 8 | 0 |
| 3 | 700 | 1.6 | 1 | 8 | 0 |
| 4 | 700 | 1.4 | 1 | 8 | 0 |
| 5 | 700 | 1.4 | 1 | 8 | 1 |
| 6 | 700 | 2.3 | 1 | 10 | 0 |
| 7 | 700 | 2.3 | 5 | 9 | 0 |
| 8 | 700 | 2.0 | 1 | 10 | 0 |
| 9 | 700 | 2.0 | 5 | 9 | 0 |
| 10 | 700 | 1.9 | 1 | 10 | 0 |
| 11 | 650 | 2.4 | 1 | 25 | 0 |
| 12 | 650 | 2.4 | 5 | 10 | 2 |
| 13 | 650 | 2.5 | 1 | 30 | 2 |
| 14 | 650 | 2.5 | 5 | 10 | 3 |

It is apparent from Table II that the method of this invention is effective in maximizing wetting of the gold surface by the solder and hermeticity of the solder seal.

EXAMPLE 4

Two hundred ceramic parts which had been heat-treated in accordance with Examples 1-2 at 650° C. were subjected to actual die-attach at 420° C. for 1 minute, and were then evaluated as described in Example 2. Only one part displayed non-wetting of the gold by the solder, and only 6 parts were non-hermetic; in all six, the non-hermeticity could be attributed to factors other than diffusion/oxidation of nickel. By contrast, as high a percentage as 50% non-wetted parts is typically encountered when the prior art method not involving a heat treatment is employed.

What is claimed is:

1. A method for preparing a heat-sealable metal coating on a ceramic article having a nickel or cobalt underlayer and a metallic gold overlayer on at least a portion of its surface, said method comprising the steps of heat-treating said layers in a reducing atmosphere at a temperature of at least about 650° C., thereby causing diffusion of nickel or cobalt into a sintering of said gold overlayer and decreasing the nickel or cobalt activity therein, and subsequently depositing a final layer of metallic gold directly on said overlayer.

2. A method according to claim 1 wherein the underlayer comprises nickel.

3. A method according to claim 2 wherein the gold overlayer has been deposited by electroless deposition.

4. A method according to claim 2 wherein the gold overlayer has been deposited by electrolytic deposition.

5. A method according to claim 2 wherein the final gold layer is deposited by electroless deposition.

6. A method according to claim 2 wherein the final gold layer is deposited by electrolytic deposition.

7. A method according to claim 2 wherein the reducing atmosphere comprises hydrogen in admixture with an inert gas.

8. A method according to claim 7 wherein the inert gas is argon.

9. A method according to claim 7 wherein the reducing atmosphere comprises about 5-10% hydrogen by volume.

10. A method according to claim 7 wherein the heat treatment temperature is in the range of about 680°-720° C.

* * * * *